(12) United States Patent
Bellaouar

(10) Patent No.: US 10,211,825 B2
(45) Date of Patent: Feb. 19, 2019

(54) CIRCUITS HAVING A SWITCH WITH BACK-GATE BIAS

(71) Applicant: GLOBALFOUNDRIES Inc., Grand Cayman (KY)

(72) Inventor: Abdellatif Bellaouar, Richardson, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/616,527

(22) Filed: Jun. 7, 2017

(65) Prior Publication Data

US 2018/0358962 A1 Dec. 13, 2018

(51) Int. Cl.

| | |
|---|---|
| *H04B 1/44* | (2006.01) |
| *H03K 17/16* | (2006.01) |
| *H01L 23/66* | (2006.01) |
| *H03F 3/195* | (2006.01) |
| *H03F 3/21* | (2006.01) |
| *H01L 29/78* | (2006.01) |

(Continued)

(52) U.S. Cl.
CPC .......... *H03K 17/161* (2013.01); *H01L 23/66* (2013.01); *H01L 27/1203* (2013.01); *H01L 29/7831* (2013.01); *H03F 3/195* (2013.01); *H03F 3/211* (2013.01); *H03F 3/213* (2013.01); *H04B 1/44* (2013.01); *H01L 21/84* (2013.01); *H01L 28/20* (2013.01); *H01L 28/40* (2013.01); *H01L 2223/6677* (2013.01); *H03F 2200/18* (2013.01); *H03F 2200/294* (2013.01); *H03F 2200/451* (2013.01)

(58) Field of Classification Search
CPC ... H03K 17/161; H01L 23/66; H01L 27/1203; H01L 29/7831; H01L 21/84; H01L 28/20; H01L 28/40; H01L 2223/6677; H03F 3/195; H03F 3/211; H03F 3/213; H03F 2200/18; H03F 2200/294; H03F 2200/451; H04B 1/44
See application file for complete search history.

(56) References Cited

U.S. PATENT DOCUMENTS

| | | | |
|---|---|---|---|
| 5,818,099 A | 10/1998 | Burghartz | |
| 2003/0102568 A1* | 6/2003 | Tomishima | G01R 31/31723 257/777 |

(Continued)

FOREIGN PATENT DOCUMENTS

CN 103700701 A 4/2014

OTHER PUBLICATIONS

Skyworks Solutions, Inc., "SKY85608-11 Data Sheet", Apr. 26, 2016.
RFMD, "RF5540 Product Data Sheet", Jan. 28, 2013.

*Primary Examiner* — Xin Jia
(74) *Attorney, Agent, or Firm* — Thompson Hine LLP; David Cain

(57) ABSTRACT

Electronic circuits with a switch and methods for operating a switch in an electronic circuit. A first amplifier is coupled by a first path with an antenna. A second amplifier is coupled by a second path with the antenna. A transistor is coupled with the first path at a node. The first transistor includes a back gate. A back-gate bias circuit is coupled with the back gate of the first transistor. The back-gate bias circuit is configured to supply a bias voltage to the back gate of the first transistor that lowers a threshold voltage of the transistor.

18 Claims, 2 Drawing Sheets

(51) Int. Cl.
*H01L 27/12* (2006.01)
*H03F 3/213* (2006.01)
*H01L 49/02* (2006.01)
*H01L 21/84* (2006.01)

(56) References Cited

U.S. PATENT DOCUMENTS

| | | | |
|---|---|---|---|
| 2007/0232241 A1* | 10/2007 | Carley | H04B 1/44 455/83 |
| 2015/0129967 A1 | 5/2015 | Kumar et al. | |
| 2016/0209355 A1* | 7/2016 | Tseng | G01N 27/4145 |

* cited by examiner

CIRCUITS HAVING A SWITCH WITH BACK-GATE BIAS

BACKGROUND

The invention relates generally to electronic circuits and, in particular, to electronic circuits with a switch and methods for operating a switch in an electronic circuit.

Radio-frequency integrated circuits (RFICs) are found in many type of devices, such as mobile phones. An RFIC generally requires a switch to select and control connections between an antenna, a transmitter circuit (e.g., a power amplifier), and a receiver circuit (e.g., a low noise amplifier). Switches may be implemented in an RFIC using semiconductor devices, typically a single field-effect transistor (FET) or multiple FETs that are stacked. Such switches may introduce an insertion loss that can affect the efficiency of the transmitter circuit and the noise figure of the receiver circuit.

Improved electronic circuits with a switch and methods for operating a switch in an electronic circuit are needed.

SUMMARY

In an embodiment of the invention, an electronic circuit includes a first amplifier coupled by a first path with an antenna, a second amplifier coupled by a second path with the antenna, and a transistor coupled with the first path at a node. A back-gate bias circuit is coupled with a back gate of the transistor. The back-gate bias circuit is configured to supply a bias voltage to the back gate of the transistor that lowers a threshold voltage of the transistor.

In an embodiment of the invention, a method of operating an electronic circuit includes applying a bias voltage to a back gate of a transistor that is coupled at a first node with a first path between an antenna and a first amplifier. In response to applying the bias voltage, a signal is transmitted from a second amplifier over a second path to the antenna. The bias voltage supplied to the back gate of the transistor lowers a threshold voltage of the transistor.

BRIEF DESCRIPTION OF THE DRAWINGS

The accompanying drawings, which are incorporated in and constitute a part of this specification, illustrate various embodiments of the invention and, together with a general description given above and the detailed description of the embodiments given below, serve to explain the embodiments of the invention.

DETAILED DESCRIPTION

Figure 1:
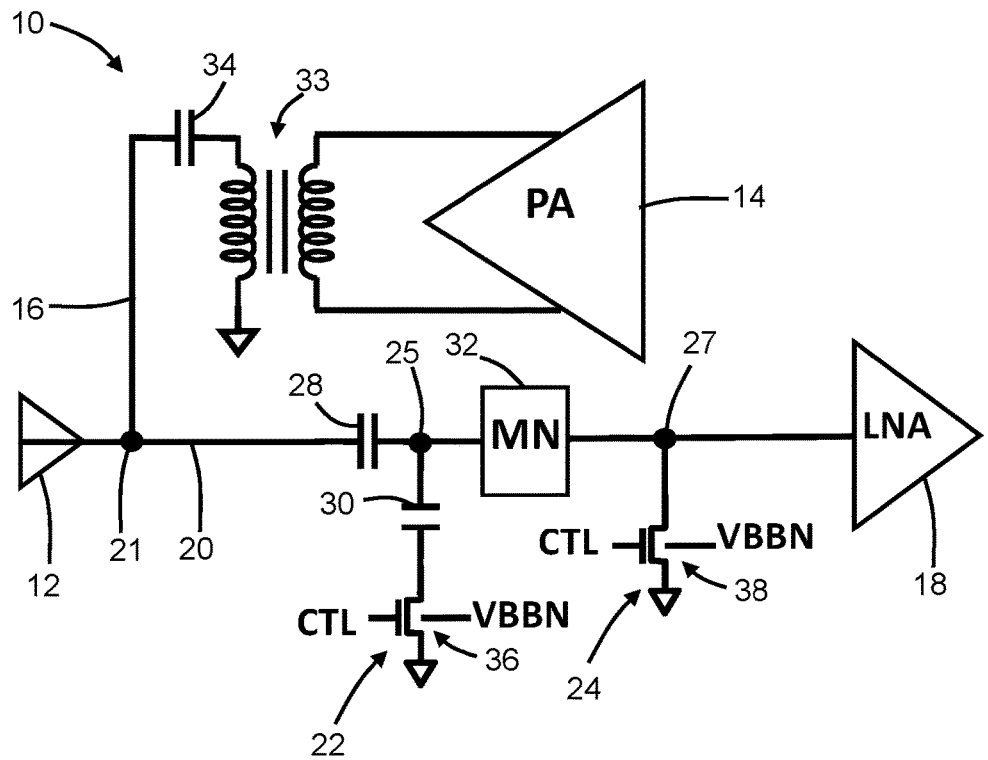
FIG. 1 is a schematic view of an electronic circuit in accordance with embodiments of the invention.

With reference to FIG. 1 and in accordance with embodiments of the invention, an electronic circuit 10 includes an antenna 12, a power amplifier (PA) 14, a transmit (TX) branch or path 16 connecting the PA 14 to the antenna 12, a low-noise amplifier (LNA) 18, and a receive (RX) branch or path 20 connecting the LNA 18 to the antenna 12. The antenna 12, the TX path 16, and the RX path 20 are commonly connected at a node 21. The electronic circuit 10 further includes a field-effect transistor 22 that is coupled to the RX path 20 at a node 25 and that operates as a switch in the electronic circuit 10. The electronic circuit 10 further includes a field-effect transistor 24 that has a drain coupled with the RX path 20 at a node 27 and a source coupled with ground. The field-effect transistor 24 provides a power-down function that furnishes additional attenuation of the transmit signal when the LNA 18 is switched OFF.

The electronic circuit 10 may be a component of a radio-frequency integrated circuit (RFIC) in, for example, a mobile phone or other type of mobile device. The PA 14 is configured to accept a comparatively strong predictable signal from other circuitry of the RFIC with a high signal-to-noise ratio and to boost its power for transmission over the TX path 16 to the antenna 12. The LNA 18 is configured to receive an unpredictable low-power, low-voltage signal, along with associated random noise presented to it, from the antenna 12 over the RX path 20 and to boost its power to a useful level.

The field-effect transistor 22 includes a back gate, generally indicated by reference numeral 36, that is available to be electrically biased in order to adjust the threshold voltage of the field-effect transistor 22. Similarly, the field-effect transistor 24 includes a back gate, generally indicated by reference numeral 38, that is available to be electrically biased in order to adjust the threshold voltage of the field-effect transistor 24. The threshold voltage (Vt) represents the minimum applied voltage needed at the gate electrodes of the field-effect transistors 22, 24 to place the field-effect transistors 22, 24 in an ON state. The respective threshold voltages of the field-effect transistors 22, 24 may be lowered (i.e., reduced to smaller values) by applying a back-gate bias voltage to their respective back gates 36, 38.

In an embodiment, the field-effect transistors 22, 24 may be super low-threshold voltage field-effect transistors (SLVT for Super Low Vt). The threshold voltages of the field-effect transistors 22, 24 can be selected using, among other parameters, the work function metals for the gate electrodes, the transistor type (i.e., n-type or p-type), and/or the conductivity type of the semiconductor material of the back gates 36, 38. In an embodiment, the field-effect transistors 22, 24 may both comprise n-type field-effect transistors.

The electronic circuit 10 further includes a capacitor 28 located in the RX path 20 between node 25 and the antenna 12, a capacitor 30 located between the field-effect transistor 22 and node 25, and a matching network (MN) 32 located in the RX path 20 between node 25 and node 27. The matching network 32 may include one or more reactive elements, such as one or more inductors and/or one or more capacitors, that are configured to optimize signal delivery from the antenna 12 to the LNA 18 through impedance matching. A transformer 33 and a matching capacitor 34 are located in the TX path 16 between the antenna 12 and the input to the PA 14.

The field-effect transistor 22 has a drain that is connected with ground, and a source that is connected with the node 25 through the capacitor 30. The capacitors 28, 30 may be sized such that the capacitance (C2) of the capacitor 30 is significantly greater than the capacitance (C1) of the capacitor 28. The capacitance ratio of the capacitors 28, 30 may be selected at least in part to attenuate any high-swing value of transmitted RF signal such that the input to the LNA 18 is protected. The voltage on the drain of field-effect transistor 22 is a function of its on-resistance versus the impedance of capacitor 30. A reduced value of the on-resistance for field-effect transistor 22, which may be facilitated through a bias voltage applied to its back gate 36, may ensure that the voltage swing on the drain of field-effect transistor 22 is kept below its reliability rating. The reduced value of the on-resistance of field-effect transistor 24 may improve attenuation so that the ratio of C2 to C1 can be limited from being excessively high.

A back-gate bias circuit, such as a back-gate bias circuit 40 (FIG. 2) or a back-gate bias circuit 46 (FIG. 3), may serve as a source or supply of a back-gate bias voltage (VBBN) directed to the respective back gates 36, 38 of the field-effect transistors 22, 24. To that end, either the back-gate bias circuit 40 or the back-gate bias circuit 46 may be coupled to the back gate 36 of the field-effect transistor 22 and may also be coupled to the back gate 38 of the field-effect transistor 24. The back-gate bias circuits 40, 46 are each configured to supply a bias voltage (VH) to the back gates 36, 38 of the field-effect transistors 22, 24 or to supply a low voltage (e.g., ground) to the back gates 36, 38 of the field-effect transistors 22, 24. The concurrent application of VBBN equal to VH to the back gates 36, 38 of the field-effect transistors 22, 24, which occurs during operation in TX mode, allows the use of field-effect transistors 22, 24 characterized by a small size, which may improve the impact of the field-effect transistors 22, 24 on the noise figure during RX mode. The value of VH may depend on the high logic requirement of the RFIC, and VH may be supplied from a battery.

When the electronic circuit 10 is operating in receive (RX) mode, the LNA 18 is connected with the antenna 12 for receiving signals from the antenna 12, and the input impedance on the TX path 16 is high to isolate the PA 14. The high impedance prevents RF signals from propagating down the TX path 16 during RX mode. In RX mode, the LNA 18 is switched ON, the PA 14 is switched OFF and its outputs are floating, the field-effect transistors 22, 24 are switched OFF, and VBBN is set to a low voltage (e.g., 0 volts or ground). The threshold voltages of the field-effect transistors 22, 24 are not reduced because their respective back gates 36, 38 are grounded and unbiased, which improves their isolation when the electronic circuit 10 is operating in RX mode.

When the electronic circuit 10 is operating in transmission (TX) mode, the PA 14 is connected with the antenna 12 and the RX path 20 presents a high input impedance that blocks the RX path 20 and isolates the LNA 18. In TX mode, the PA 14 is switched ON, the LNA 18 is switched OFF, the field-effect transistors 22, 24 are switched ON, and a VBBN equal to VH is applied to the back gates 36, 38 of the field-effect transistors 22, 24. The threshold voltages of the field-effect transistors 22, 24 are reduced by the back-gate biasing during their ON state such that their on-resistances and effective switch sizes are reduced in comparison with the OFF state. The reduction in the effective switch size lowers the drain parasitic capacitance of the field-effect transistors 22, 24 when the electronic circuit 10 is operating in TX mode.

The drain parasitic capacitance of field-effect transistor 22 may be reduced due to the availability of the back gate 36 to bias when the electronic circuit 10 is operating in TX mode. Hence, the total capacitance at node 25, which is the equivalent capacitor at node 27, may be lowered. The drain parasitic capacitance of field-effect transistor 24 may also be reduced due to the availability of the back gate 38 to bias in TX mode. Hence, the total capacitance at node 27 is lowered. The lowered capacitances at node 25 and node 27 may reduce the impact on the noise figure.

Figure 2:
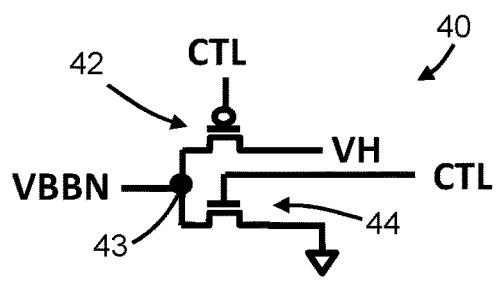
FIG. 2 is a schematic view of a back-gate bias circuit for generating a back-gate bias voltage in accordance with embodiments of the invention.

With reference to FIG. 2 and in accordance with embodiments of the invention, the back-gate bias circuit 40 may be constructed from a field-effect transistor 42 and a field-effect transistor 44 that are coupled in parallel with a node 43 serving as an output to the electronic circuit 10. The node 43 is connected to the back gate 36 (FIG. 1) of the field-effect transistor 22 and to the back gate 38 (FIG. 1) of the field-effect transistor 24. The field-effect transistor 42 has a source that is coupled with a power supply that supplies the voltage (VH) and a drain that is coupled with the node 43. The field-effect transistor 44 has a drain that is coupled with ground and a source that is coupled with the node 43. A common control signal (CTL) can be simultaneously applied to the gates of the field-effect transistors 42, 44 for purposes of switching.

The field-effect transistors 42, 44, which have complementary types (i.e., p-type and n-type), may be either laterally-diffused metal-oxide-semiconductor (LDMOS) devices that include a drift region or input/output (I/O) devices that include a thick gate dielectric. In an embodiment, the field-effect transistor 42 may be a p-type field-effect transistor and the field-effect transistor 44 may be an n-type field-effect transistor. Device selection for the field-effect transistors 42, 44 may be contingent upon the supply voltage(s) available to the RFIC. In an embodiment, the value of VH may be less than or equal to two (2) volts if I/O devices are used as the field-effect transistors 42, 44. The concurrent application of the same control signal (CTL) to the gates of both field-effect transistors 42, 44 results in one being switched ON and the other being switched OFF in order to provide the binary output to node 43.

During TX mode, the field-effect transistor 42 is configured, when switched ON by a control signal (CTL) equal to low or logic 0 applied to its gate, to supply VBBN equal to VH to the node 43 and subsequently from the node 43 to the back gates 36, 38 of field-effect transistors 22, 24. The application of VBBN equal to VH to the back gates 36, 38 of field-effect transistors 22, 24 lowers their respective threshold voltages. The field-effect transistor 44 is switched OFF by the control signal of low logic applied to its gate, which isolates the node 43 from ground.

During RX mode, the field-effect transistor 44 is configured, when switched ON by a control signal equal to high or logic 1 applied to its gate, to supply VBBN equal to ground (i.e., 0 volts) to the node 43 and subsequently from the node 43 to the back gates 36, 38 of field-effect transistors 22, 24. The field-effect transistor 42 is switched OFF when the control signal of high is applied to its gate in order to isolate the node 43 from the power supply.

Because the field-effect transistors 42, 44 have complementary types, the same control signal may be applied to the gates of both devices to provide the two different states of the back-gate bias circuit 40 during RX mode and TX mode. For example, if field-effect transistor 42 is a p-type field-effect transistor and field-effect transistor 44 is an n-type field-effect transistor, the control signal during TX mode may be low and the control signal during RX mode may be high.

Figure 3:
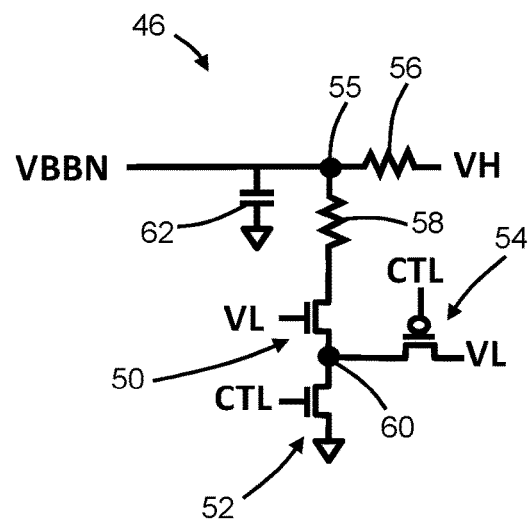
FIG. 3 is a schematic view of a back-gate bias circuit for generating a back-gate bias voltage in accordance with embodiments of the invention.

With reference to FIG. 3 and in accordance with embodiments of the invention, a back-gate bias circuit 46 may be used as a source of VBBN instead of the back-gate bias circuit 40 (FIG. 2). The back-gate bias circuit 46 may be constructed from field-effect transistors 50, 52, 54 and resistors 56, 58, and may include a node 55 that is coupled to the back gates 36, 38 of the field-effect transistors 22, 24 (FIG. 1). The node 55 of the back-gate bias circuit 40 may be coupled through the resistor 56 to a voltage (VH)

supplied from a power supply associated with the RFIC. The field-effect transistor 50 has a source that is connected with a node 60 and a drain that is connected with the node 55 through the resistor 58. The field-effect transistor 52 has a source that is connected with the drain of the field-effect transistor 50 at the node 60 and a drain that is connected with ground.

The field-effect transistors 50, 52 and the resistor 58 are coupled in series to electrical ground. The gate of the field-effect transistor 50 is coupled with a power supply different from the power supply that is supplying VH. For example, the different power supply may supply a lower bias voltage (VL), such as the bias voltage (e.g., 1.8 volts) used by the RFIC for I/O operations. The field-effect transistor 54 is configured to switch the voltage VL supplied from the lower voltage power supply to the node 60 located between the field-effect transistor 50 and the field-effect transistor 52. The gate of the field-effect transistor 52 and the gate of field-effect transistor 54 are coupled with a shared control signal (CTL) used to provide the switching. A filter capacitor 62 may be connected to node 60 in order to filter and reduce noise originating from the power supply that is supplying VH.

The back-gate bias circuit 46 may replace the back-gate bias circuit 40, for example, if the value of VH is around three (3) volts and LDMOS devices are not available for use as the field-effect transistors 50, 52. Field-effect transistor 52 and field-effect transistor 54 have complementary types and, in an embodiment, the field-effect transistor 54 may be a p-type field-effect transistor and the field-effect transistor 54 may be an n-type field-effect transistor. The field-effect transistor 50 has the same type (i.e., either p-type or n-type) as the field-effect transistor 52. The resistors 56, 58 are sized such that the resistance (R1) of the resistor 56 is significantly higher than the resistance (R2) of resistor 58. In an embodiment, the resistance (R1) of the resistor 56 may be 50 k·Ω and the resistance (R2) of the resistor 58 may be 1 k·Ω.

During TX mode, the control signal (CTL) applied to the gates of field-effect transistor 52 and field-effect transistor 54 is low or logic 0. Field-effect transistor 54 is switched ON by the control signal and, as a result, the lower power supply voltage (e.g., VL=1.8 volts) is supplied to the node 60. The field-effect transistors 52 and 54 are switched OFF, isolates the node 60 from ground. The result is that the back-gate bias circuit 46 supplies VBBN equal to VH at the node 55, which is supplied from the node 55 to the back gates 36, 38 of field-effect transistors 22, 24 during TX mode. The application of VBBN equal to VH to the back gates 36, 38 of field-effect transistors 22, 24 lowers their respective threshold voltages.

During RX mode, the control signal (CTL) applied to the gates of field-effect transistor 52 and field-effect transistor 54 is high or logic 1. Field-effect transistor 54 is switched OFF by the control signal and, as a result, the lower power supply voltage (e.g., VL=1.8 volts) is blocked from the node 60. The field-effect transistors 50 and 52 are switched ON, which connects the node 60 with ground. As a result, the back-gate bias circuit 46 behaves like a resistive divider because both of the field-effect transistors 50, 52 are switched ON. The value of VBBN at the node 55 is equal to the input voltage VH multiplied by a ratio of the resistance R2 of resistor 58 divided by the sum of the resistance R1 of resistor 56 and the resistance R2 of resistor 58. Because the resistance R1 of resistor 56 is significantly greater than the resistance R2 of resistor 58, VBBN during RX mode is effectively equal to zero (0) volts.

Figure 4:
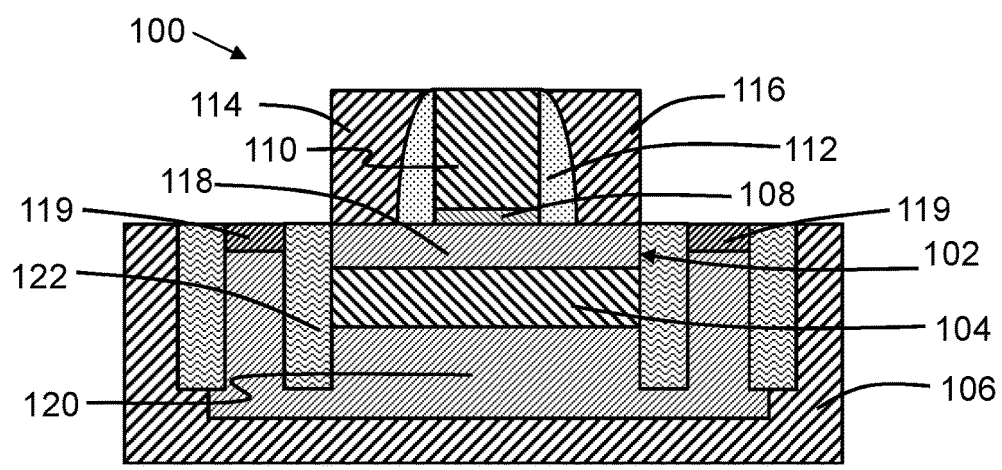
FIG. 4 is a cross-sectional view of a field-effect transistor with a back gate that may be used in constructing the field-effect transistors of the RF switch of FIG. 1.

With reference to FIG. 4 in which like reference numerals refer to like features in FIG. 1, a field-effect transistor 100 is shown that may be used as a device structure for the field-effect transistors 22, 24. The field-effect transistor 100 may be fabricated using a semiconductor-on-insulator (SOI) substrate by complementary metal oxide semiconductor (CMOS) processes during front-end-of-line (FEOL) processing. The SOI substrate includes a device layer 102, a buried dielectric layer in the form of a buried oxide (BOX) layer 104 comprised of an oxide of silicon (e.g., $SiO_2$), and a handle wafer 106. The device layer 102 is separated from the handle wafer 106 by the intervening BOX layer 104 and is considerably thinner than the handle wafer 106. The device layer 102 and the handle wafer 106 may be comprised of a single crystal semiconductor material, such as single crystal silicon. The device layer 102 is electrically isolated from the handle wafer 106 by the BOX layer 104. In an embodiment, the SOI substrate may be an extremely thin semiconductor-on-insulator (ETSOI) substrate and may be used to fabricate the field-effect transistors 22, 24 using CMOS FEOL processing as fully-depleted SOI devices (FDSOI).

The field-effect transistor 100 includes a gate dielectric 108 and a gate electrode 110 that is separated from the device layer 102 by the gate dielectric 108. The gate electrode 110 may be comprised of a conductor, such as doped polysilicon or one or more metals, and the gate dielectric 108 may be comprised of a dielectric or insulating material. Non-conductive spacers 112 may be provided at the vertical sidewalls of the gate electrode 110.

The field-effect transistor 100 includes raised source/drain regions 114, 116 that are arranged on opposite sides of the gate electrode 110 and are separated from the gate electrode 110 by the non-conductive spacers 112. As used herein, the term "source/drain region" means a doped region of semiconductor material that can function as either a source or a drain of the field-effect transistor 100. The semiconductor material of the source/drain regions 114, 116 may comprise an n-type dopant from Group V of the Periodic Table (e.g., phosphorus (P) or arsenic (As)) that is effective to impart n-type conductivity. Alternatively, the semiconductor material of the source/drain regions 114, 116 may comprise a p-type dopant selected from Group III of the Periodic Table (e.g., boron (B)) that is effective to impart p-type conductivity.

A portion of the device layer 102 between the source/drain regions 114, 116 and vertically beneath the gate electrode 110 constitutes a transistor body 118 through which a gated current is switched through a channel. Shallow trench isolation 122 is formed that, in conjunction with the BOX layer 104, delimits the transistor body 118. The field-effect transistor 100 further includes a back gate 120 in the handle wafer 106 that is aligned with the gate electrode 110 and separated from the transistor body 118 by the BOX layer 104. The transistor body 118 is arranged vertically between the back gate 120 and the gate electrode 110. Highly-doped contacts 119 provide a connection with the back gate 120. The semiconductor material of the back gate 120 may be doped to have the same conductivity type (i.e., polarity) as the semiconductor material of the source/drain regions 114, 116 or, alternatively, the semiconductor material of the back gate 120 may be doped to have the opposite conductivity type (i.e., polarity) from the semiconductor material of the source/drain regions 114, 116. Among other parameters, the threshold voltage of the field-effect transistor 100 can be adjusted by applying a bias potential (e.g., VBBN) to the back gate 120.

The gate electrode 110, when biased with a given voltage exceeding the threshold voltage, applies an electric field to the transistor body 118 to switch the field-effect transistor 100 between an ON state in which its channel becomes conductive and an OFF state. In the ON state, charge carriers flow in the channel through the transistor body 118 from the one of the source/drain regions 114, 116 serving as a source for field-effect transistor 100 to the other of the source/drain regions 114, 116 serving as the drain of the field-effect transistor 100. In the OFF state, the transistor body 118 of the field-effect transistor 100 may be considered to be fully depleted because there are substantially no free charge carriers over the entire height of the transistor body 118. In embodiments in which the field-effect transistor 100 has a FDSOI device structure, this depletion layer extends vertically in the transistor body 118 over the entire thickness of the device layer 102.

In an embodiment, the field-effect transistors 22, 24 may be super low-threshold voltage field-effect transistors implemented as n-type field-effect transistors with an n-type back gate 120.

The field effect transistors 42, 44 of the back-gate bias circuit 40 and the field-effect transistors 50, 52, 54 of the back-gate bias circuit 46 may have a construction similar to field-effect transistor 100 with the exception of the omission of the back gate 120.

The methods as described above may be used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A electronic circuit for use with an antenna, the electronic circuit comprising:
a first amplifier coupled by a first path with the antenna;
a second amplifier coupled by a second path with the antenna;
a first transistor coupled with the first path at a first node, the first transistor having a back gate; and
a back-gate bias circuit coupled with the back gate of the first transistor at a second node, the back-gate bias circuit configured to supply a bias voltage to the back gate of the first transistor that lowers a threshold voltage of the first transistor, a first resistor coupling the second node with a first power supply that is configured to supply the bias voltage, and a second resistor coupled with ground.

2. The electronic circuit of claim 1 further comprising:
a substrate including a device layer, a handle wafer, and a buried dielectric layer arranged between the device layer and the handle wafer,
wherein the back gate of the first transistor is located in the handle wafer, the first transistor includes a gate electrode, a source, a drain, and a body in the device layer between the source and the drain, and the buried dielectric layer is arranged vertically between the body of the first transistor and the back gate of the first transistor.

3. The electronic circuit of claim 1 further comprising:
a second transistor coupled with the first path at a third node, the second transistor having a back gate,
wherein the second node of the back-gate bias circuit is further coupled with the back gate of the second transistor, and the back-gate bias circuit is configured to supply the bias voltage to the back gate of the second transistor that lowers a threshold voltage of the second transistor.

4. The electronic circuit of claim 3 wherein the back-gate bias circuit is configured to concurrently supply the bias voltage to the back gate of the first transistor and to the back gate of the second transistor.

5. The electronic circuit of claim 3 wherein the first transistor has a drain that is connected with ground and a source that is connected with the first node, and further comprising:
a first capacitor between the source of the first transistor and the first node.

6. The electronic circuit of claim 5 wherein the second transistor has a drain that is connected with the third node and a source that is connected with ground.

7. The electronic circuit of claim 5 further comprising:
a second capacitor in the first path between the first node and the antenna.

8. The electronic circuit of claim 1 wherein the first amplifier and the second amplifier are configured to operate in a transmit mode in which a first signal is communicated from the first amplifier to the antenna and in a receive mode in which a second signal is communicated from the antenna to the first amplifier, and the back-gate bias circuit supplies the bias voltage to the back gate of the first transistor in the transmit mode.

9. The electronic circuit of claim 1 wherein the back-gate bias circuit further includes a second transistor and a third transistor, the second transistor has a drain coupled by the second resistor with the second node and a source, and the third transistor has a drain coupled with the source of the second transistor at a third node and a source coupled with ground.

10. The electronic circuit of claim 9 wherein the back-gate bias circuit further includes a fourth transistor coupling the third node with a second power supply that is configured to selectively supply a low voltage that is less than the bias voltage to the second node.

11. The electronic circuit of claim 1 wherein the first path is a receive path, and the first amplifier is a low-noise amplifier.

12. The electronic circuit of claim 1 wherein the second path is a transmit path, and the second amplifier is a power amplifier.

13. The electronic circuit of claim 1 wherein the first transistor is a fully-depleted silicon-on-insulator device structure fabricated using complementary metal-oxide-semiconductor processes.

14. The electronic circuit of claim 1 wherein the first transistor is an n-type field-effect transistor.

15. The electronic circuit of claim 1 wherein the first transistor is a super low-voltage field-effect transistor.

16. A method of operating an electronic circuit, the method comprising:
   applying a bias voltage to a back gate of a first transistor that is coupled at a first node with a first path between an antenna and a first amplifier; and
   in response to applying the bias voltage, transmitting a first signal from a second amplifier over a second path to the antenna,
   wherein the bias voltage lowers a threshold voltage of the first transistor, and applying the bias voltage to the back gate of the first transistor further comprises:
   supplying the bias voltage from a power source through a first resistor to a second node coupled with the back gate of the first transistor; and
   switching a second transistor to isolate a second resistor connected to the second node from ground.

17. The method of claim 16 further comprising:
   receiving a second signal at the first amplifier from the antenna over the first path,
   wherein the bias voltage is removed from the back gate in response to receiving the second signal.

18. The method of claim 16 wherein a third transistor is coupled at a third node with the first path between the antenna and the first amplifier, and further comprising:
   in response to transmitting the first signal from the second amplifier, applying the bias voltage to a back gate of the third transistor.

* * * * *